(12) United States Patent
Chung et al.

(10) Patent No.: US 7,999,341 B2
(45) Date of Patent: Aug. 16, 2011

(54) DISPLAY DRIVER INTEGRATED CIRCUIT DEVICE, FILM, AND MODULE

(75) Inventors: Ye-chung Chung, Suwon-si (KR); Sa-yoon Kang, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 57 days.

(21) Appl. No.: 12/706,888

(22) Filed: Feb. 17, 2010

(65) Prior Publication Data

US 2010/0141617 A1 Jun. 10, 2010

Related U.S. Application Data

(62) Division of application No. 11/488,011, filed on Jul. 18, 2006, now Pat. No. 7,683,471.

(30) Foreign Application Priority Data

Jul. 18, 2005 (KR) .................. 10-2005-0064755

(51) Int. Cl.
*H01L 31/0232* (2006.01)
*H01L 23/48* (2006.01)

(52) U.S. Cl. ........ 257/432; 257/688; 257/778; 257/702; 257/E23.065

(58) Field of Classification Search .......... 257/432, 257/702, 688, 778, E23.065
See application file for complete search history.

(56) References Cited

U.S. PATENT DOCUMENTS

| | | | |
|---|---|---|---|
| 5,905,303 A | 5/1999 | Kata et al. | |
| 5,920,115 A | 7/1999 | Kimura et al. | |
| 5,986,334 A | 11/1999 | Lee | |
| 5,986,342 A | 11/1999 | Uchiyama et al. | |
| 6,018,188 A | 1/2000 | Yusa | |
| 6,448,634 B1 | 9/2002 | Hashimoto | |
| 6,476,467 B2 | 11/2002 | Nakamura et al. | |
| 6,833,612 B2 | 12/2004 | Kinsman | |
| 6,885,107 B2 * | 4/2005 | Kinsman | 257/778 |
| 7,443,038 B2 * | 10/2008 | Kinsman | 257/778 |
| 2001/0026008 A1 | 10/2001 | Tsuneda et al. | |
| 2002/0093078 A1 | 7/2002 | Paek | |
| 2005/0230844 A1 * | 10/2005 | Kinsman | 257/778 |
| 2007/0252227 A1 * | 11/2007 | Fukuda et al. | 257/432 |
| 2010/0052086 A1 * | 3/2010 | Kinsman | 257/432 |

FOREIGN PATENT DOCUMENTS

| | | |
|---|---|---|
| JP | 02246235 A | 10/1990 |
| JP | 06003684 A | 1/1994 |
| JP | 2001142090 A | 5/2001 |
| KR | 1020010103390 A | 11/2001 |

* cited by examiner

*Primary Examiner* — Nitin Parekh
(74) *Attorney, Agent, or Firm* — Volentine & Whitt, PLLC

(57) ABSTRACT

A rectangular display driver integrated circuit device adapted for use with a flat panel display (FPD) device is disclosed and comprises, a plurality of input pads arranged in a central portion of the display driver integrated circuit device, and a plurality of output pads arranged along edges of all four sides of the display driver integrated circuit device. An associated film, film package, and flat panel display (FPD) module adapted to receive the display driver integrated circuit device are also disclosed.

3 Claims, 6 Drawing Sheets

DISPLAY DRIVER INTEGRATED CIRCUIT DEVICE, FILM, AND MODULE

CROSS-REFERENCE TO RELATED APPLICATION

This is a divisional of application Ser. No. 11/488,011 filed on Jul. 18, 2006, which is incorporated herein by reference in its entirety.

BACKGROUND OF THE INVENTION

1. Field of the Invention

Embodiments of the invention relate to a display driver integrated circuit device, film, and module. More particularly, embodiments of the invention relate to a display driver integrated circuit device having a particular circuit pattern related to input/output (I/O) pads, as well as a related film on which the display driver integrated circuit device is mounted and an incorporating module.

This application claims priority to Korean Patent Application No. 10-2005-0064755 filed on Jul. 18, 2005, the subject matter of which is hereby incorporated by reference.

2. Description of the Related Art

Thinner and lighter flat panel displays (FPDs) are currently state of the art in display devices. FPDs may be generally classified as liquid crystal displays (LCDs), plasma display panels (PDPs), and field emission displays (FEDs). LCDs are typically used in the manufacture of mid-sized products, such as notebook computers and desktop computers, and small-sized products, such as electronic watches, electronic calculators, and mobile communication terminals. PDPs are typically used in manufacture of larger-sized products, such as televisions.

FPDs generally include a plurality of connected driving devices. As conventionally provided, driving devices are formed from a printed circuit board (PCB) and a film package or tape package. More specifically, a plurality of driving devices are adapted to generate diverse control signals and data signals and are mounted on a PCB. An associated display driver integrated circuit device is mounted on a film package or tape, and is adapted to electrically connect the PCB to a liquid crystal panel in order to "drive" (e.g., electrically activate) elements in the liquid crystal panel.

FIG. 1 is a plan view of a conventional display driver integrated circuit device 101 on which a plurality of input pads 111 and a plurality of output pads 121 are arranged. Referring to FIG. 1, the conventional display driver integrated circuit device 101 includes input pads 111 and output pads 121 arranged along all four sides of a rectangular film package or tape. In the illustrated example, input pads 111 are arranged along a designated "front" side, and output pads 121 are arranged along designated "right", "left" and "rear" sides, as well as the front side. (Those of ordinary skill in the art will recognize that the terms front, rear, left and right (or alternately first and second lateral sides) are relative positional terms defined in relation to an assumed orientation. These terms are used for purposes of description made in relation to an illustrated example).

A first pitch P1 between input pads 111 is typically greater than a second pitch P2 between output pads 121. Hence, a set of input pads 111 will occupy a relatively larger portion of the surface area provided by display driver integrated circuit device 101, thereby limiting the area available to output pads 121. As a result, it is very difficult to increase the number of output pads 121 for a given surface area.

FIG. 2 is a plan view of a conventional film 201 on which conventional display driver integrated circuit device 101 of FIG. 1 is mounted.

Referring to FIGS. 1 and 2, conventional film 201 includes an insulated substrate 205, a plurality of input terminals 211, a plurality of output terminals 221, a plurality of input signal lines 231, a plurality of output signal lines 241, and a plurality of internal leads 251. Input and output terminals 211 and 221, input and output signal lines 231 and 241, and internal leads 251 are all formed on one side of insulated substrate 205.

Input terminals 211 are adapted for connection to an associated PCB (not shown), output terminals 221 are adapted for connection to an FPD device (not shown), and internal leads 251 are adapted for connection to input and output pads 111 and 121 of display driver integrated circuit device 101.

As described above, input and output pads 111 and 121 are arranged along all four sides of conventional display driver integrated circuit device 101. Further, input and output terminals 211 and 221, input and output signal lines 231 and 241, and internal leads 251 included in conventional film 201 are formed on one side of insulated substrate 205. As a result of these related configurations, the combination of conventional display driver integrated circuit device 101 and conventional film 201 suffer from several problems.

First, there are some very real limits on the minimal separation distances between adjacent I/O pads provided by first pitch P1 between input pads 111 and second pitch P2 between output pads 121 of conventional display driver integrated circuit device 101. Therefore, as the number of input and output pads 111 and 121 increases, the overall size (i.e., surface area) of display driver integrated circuit device 101 must also be increased. Accordingly, where in many practical instances the size of display driver integrated circuit device 101 is fixed by the design of an incorporating host device, the number of input and output pads 111 and 121 simply cannot be increased.

Second, when first pitch P1 between input pads 111 and/or second pitch P2 between output pads 121 are nonetheless reduced to increase the number of available input and output pads 111 and 121, electro-magnetic interference (EMI) may be induced on signals input connected, for example, to input pads 111 from an external source.

Third, since the number of input and output pads 111 and 121 of display driver integrated circuit device 101 is limited, the number of available input and output signal lines 231 and 241 on film 201 cannot be increased. Accordingly, the number of data transmission channels of film 201 cannot be increased.

SUMMARY OF THE INVENTION

Embodiments of the invention variously provide a display driver integrated circuit device having a reduced in size, and increased number of input and output pads and/or signal lines, and greater immunity to EMI at the input pads.

Thus, in one embodiment, the invention provides a rectangular display driver integrated circuit device adapted for use with a flat panel display (FPD) device, and comprising; a plurality of input pads arranged in a central portion of the display driver integrated circuit device, and a plurality of output pads arranged along edges of all four sides of the display driver integrated circuit device.

A first pitch may separate the input pads and a second pitch less than the first pitch may separate the output pads. A plurality of bumps adhered to the plurality of input pads and the plurality of output pads may also be provided.

In another embodiment, the invention provides a film adapted to receive a rectangular display driver integrated circuit device comprising a plurality of centrally arranged input pads, and a plurality of output pads arranged along edges of all four sides of the display driver integrated circuit device, wherein the display driver integrated circuit device is adapted for use with a flat panel display (FPD) device, the film comprising; a plurality of output terminals disposed on a surface of an insulated substrate, a plurality of output signal lines disposed on the surface of the insulated substrate and respectively connected to the plurality of output terminals, a plurality of first internal leads disposed on the surface of the insulated substrate, respectively connected to the output signal lines, and arranged in a pattern defined in relation to the plurality of output pads, a plurality of input terminals disposed on an opposing surface of the insulated substrate, a plurality of input signal lines disposed on the opposing surface of the insulated substrate and connected to the input terminals, a plurality of second internal leads disposed on the surface of the insulated substrate and arranged in relation to the input pads, and a plurality of vias disposed through the insulated substrate and adapted to respectively connect the plurality of second internal leads and the plurality of input signal lines.

The plurality of input terminals may be disposed extending in a direction opposite to that of the plurality of output terminals. The plurality of input signal lines and/or the plurality of output signal lines may be covered by a protective layer, such as a solder resist.

In another embodiment, the invention provides a film package comprising; a rectangular display driver integrated circuit device mounted on a film and comprising a plurality of centrally arranged input pads, and a plurality of output pads arranged along edges of all four sides of the display driver integrated circuit device. The film comprises; a plurality of output terminals disposed on a surface of an insulated substrate, a plurality of output signal lines disposed on the surface of the insulated substrate and respectively connected to the plurality of output terminals, a plurality of first internal leads disposed on the surface of the insulated substrate, respectively connected to the output signal lines, and arranged in a pattern defined in relation to the plurality of output pads, a plurality of input terminals disposed on an opposing surface of the insulated substrate, a plurality of input signal lines disposed on the opposing surface of the insulated substrate and connected to the input terminals, a plurality of second internal leads disposed on the surface of the insulated substrate and arranged in relation to the input pads, and a plurality of vias disposed through the insulated substrate and adapted to respectively connect the plurality of second internal leads and the plurality of input signal lines.

In another embodiment, the invention provides a flat panel display (FPD) module comprising; a rectangular display driver integrated circuit device mounted on a film and comprising a plurality of centrally arranged input pads, and a plurality of output pads arranged along edges of all four sides of the display driver integrated circuit device. The film comprises; a plurality of output terminals disposed on a surface of an insulated substrate, a plurality of output signal lines disposed on the surface of the insulated substrate and respectively connected to the plurality of output terminals, a plurality of first internal leads disposed on the surface of the insulated substrate, respectively connected to the output signal lines, and arranged in a pattern defined in relation to the plurality of output pads, a plurality of input terminals disposed on an opposing surface of the insulated substrate, a plurality of input signal lines disposed on the opposing surface of the insulated substrate and connected to the input terminals, a plurality of second internal leads disposed on the surface of the insulated substrate and arranged in relation to the input pads, and a plurality of vias disposed through the insulated substrate and adapted to respectively connect the plurality of second internal leads and the plurality of input signal lines. The FPD module also comprises a printed circuit board (PCB) electrically bonded to the plurality of input terminals, and a flat panel display (FPD) device adapted to display an image and electrically bonded to the plurality of output terminals.

DESCRIPTION OF EXEMPLARY EMBODIMENTS

Figure 1:
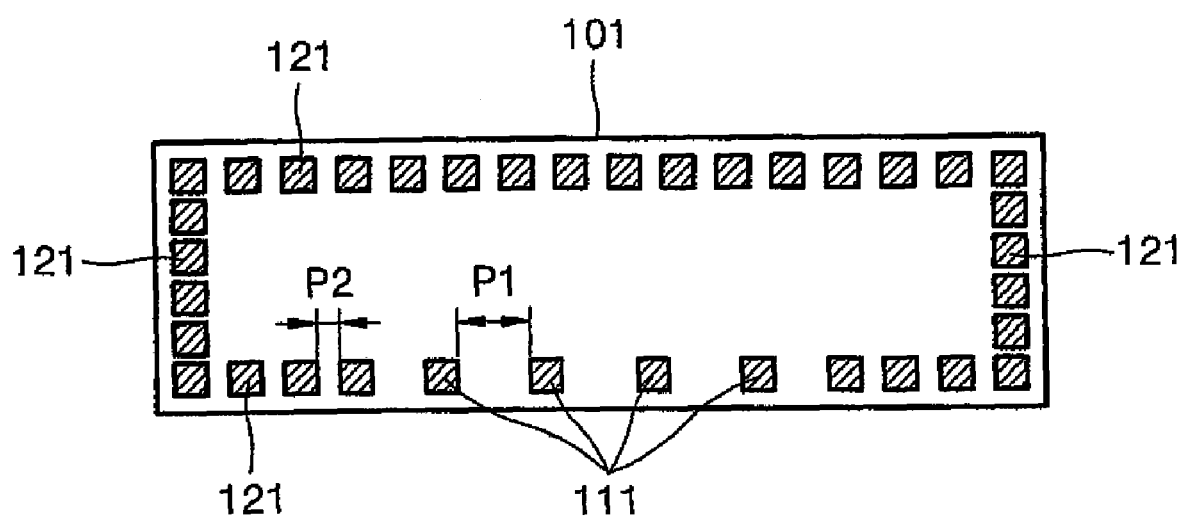
FIG. 1 is a plan view of a conventional display driver integrated circuit device on which a plurality of input pads and a plurality of output pads are arranged.
Figure 2:
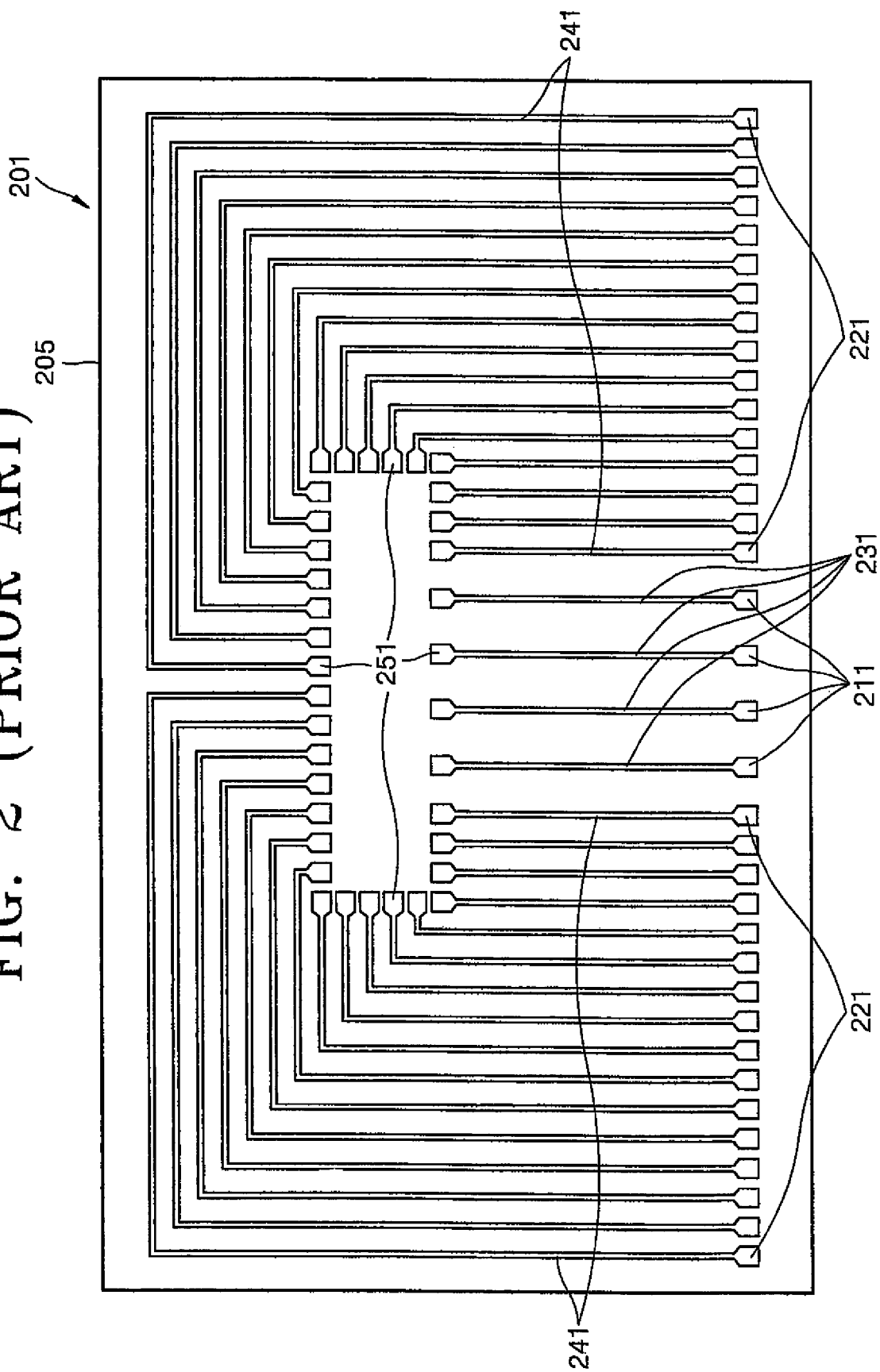
FIG. 2 is a plan view of a conventional film on which the conventional display driver integrated circuit device of FIG. 1 is mounted.

Several embodiments of the invention will now be described with reference to the accompanying drawings. The invention may, however, be embodied in many different forms and should not be construed as being limited to only the embodiments set forth therein. Rather, the embodiments are presented as teaching examples. Like reference numerals denote like elements through the specification.

Figure 3:
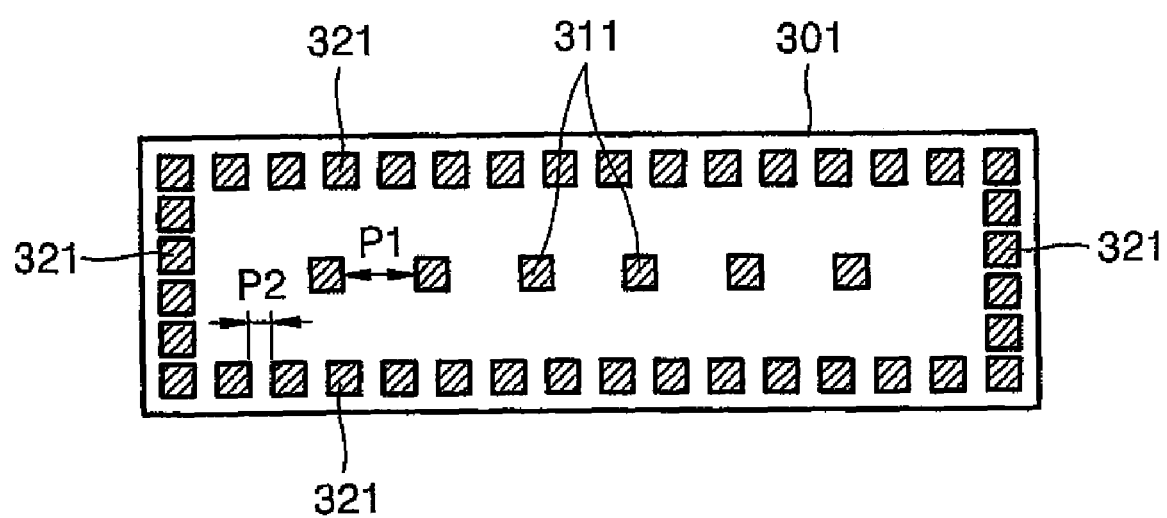
FIG. 3 is a plan view of a display driver integrated circuit device on which a plurality of input pads and a plurality of output pads are arranged according to an embodiment of the invention.

FIG. 3 is a plan view of a rectangular shaped display driver integrated circuit device 301 according to an embodiment of the invention. Display driver integrated circuit device 301 comprises arranged pluralities of input pads 311 and output pads 321.

In the illustrated embodiment, output pads 321 are arranged in linear rows and columns along front, rear, left and right edge portions of display driver integrated circuit device 301. (Alternatively, a staggered arrangement (e.g., a non-linear arrangement) of output pads may be grouped at the edges of display driver integrated circuit device 301). In contrast, input pads 311 are arranged in a central portion of display driver integrated circuit device 301. This arrangement works well in the illustrated embodiment, because, there is typically a greater number of output pads 321 than input pads 311, but the first pitch P1 between input pads 311 is larger than second pitch P2 between output pads 321.

Input pads 311 are adapted to receive external signals, and these external signals may include high levels of electrostatic energy or a voltage level surge, hereafter collectively and generically referred to as an "over voltage signal(s)". Such over voltage signals may damage circuits internal to display driver integrated circuit device 301. Thus, in order to protect the internal circuits of display driver integrated circuit device 301, conventionally understood electro-static discharge (ESD) prevention circuits (not shown) may be associated with input pads 311. It is this conventional provision of ESD circuits with input pads 311 that cause first pitch P1 to be greater than second pitch P2, and that naturally limits the minimal separation distance between adjacent input pads 311 provided by first pitch P1.

However, since input pads 311 are arranged in the illustrated embodiment shown in FIG. 3 with a central portion of display driver integrated circuit device 301, first pitch P1 between input pads 311 may be sufficient large to readily allow connection of associated ESD circuits. In addition, since input pads 311 are arranged in the central portion of display driver integrated circuit device 301, the number of output pads 321 formed edge portions of display driver integrated circuit device 301 may be increased.

Figure 4:
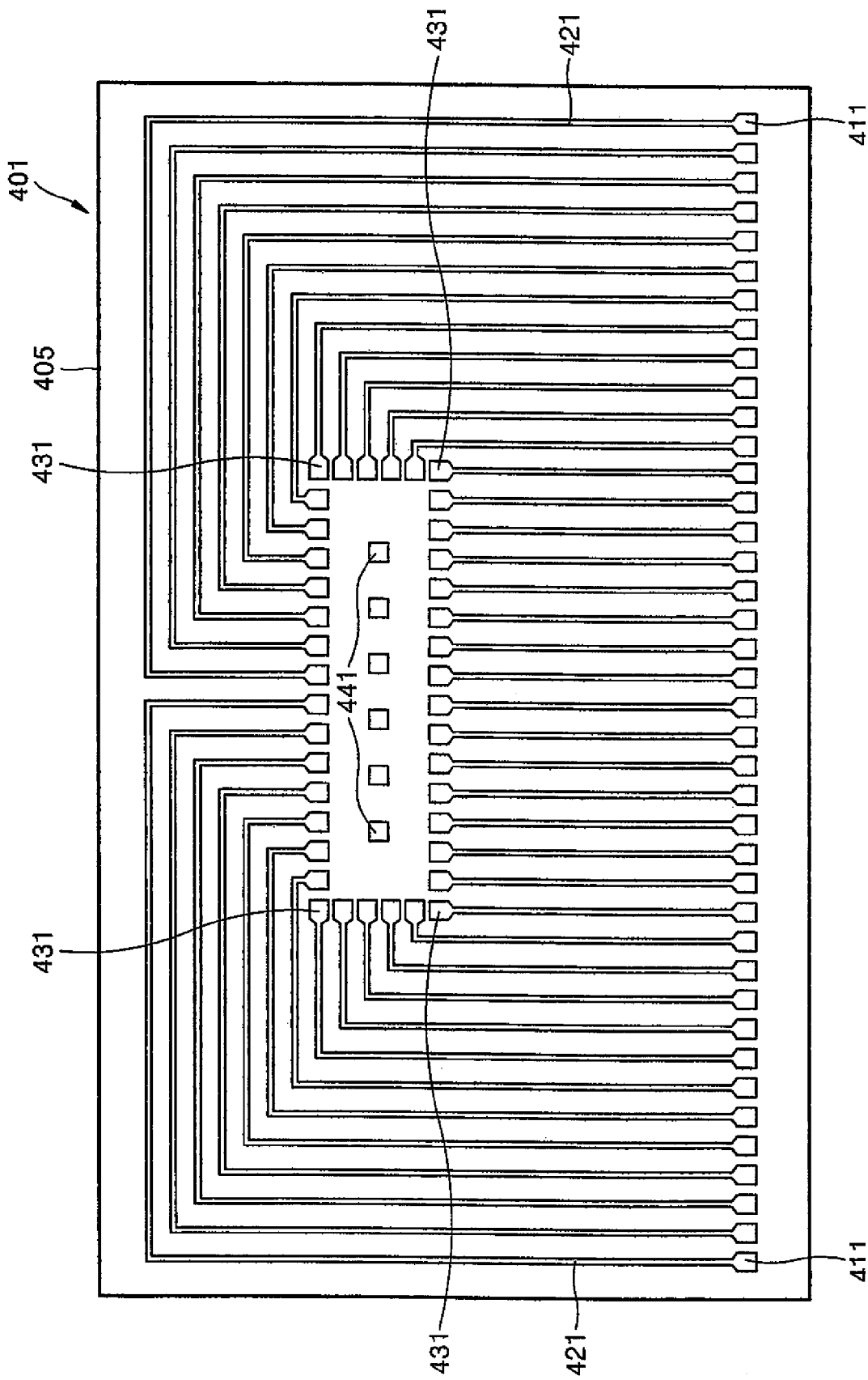
FIG. 4 is a top plan view of a film on which the display driver integrated circuit device of FIG. 3 is mounted according to an embodiment of the invention.

FIG. 4 is a top plan view of a film 401 adapted to receive display driver integrated circuit device 301 of FIG. 3 and laid out in accordance with an embodiment of the invention. Referring to FIG. 4, film 401 comprises an insulated substrate 411, a plurality of output terminals 405, a plurality of output signal lines 421, a plurality of first internal leads 431, and a plurality of second internal leads 441.

Output terminals 411 are adapted for connection to an FPD device. Output signal lines 421 are adapted for respective connection to output terminals 411.

First internal leads 431 are adapted for respective connection to output signal lines 421. Thus, in the illustrated embodiment, first internal leads 431 are arranged in a pattern defined in relation to the layout of output pads 321 in display driver integrated circuit device 301, so that first internal leads 431 may be electrically bonded to output pads 321.

Second internal leads 441 are adapted for respective connection to input pads 331 of the display driver integrated circuit device 301 and are therefore arranged in relation to the layout of input pads 331. Thus, second internal leads 441 may be readily bonded to input pads 311 of the display driver integrated circuit device 301.

All of output terminals 411, output signal lines 421, first internal leads 431, and second internal leads 441 are formed on insulated substrate 405 and may be formed from a conductive material, such as copper. In particular embodiments, the copper may be plated with tin, gold, nickel, or solder.

Output signal lines 421 may be covered with a protective layer, such as a solder resist, such that output signal lines 421 are not exposed to the effects of the surrounding environment. In contrast, output terminals 411, first internal leads 431, and second internal leads 441 are not covered with a protective layer. Insulated substrate 405 may be formed from a flexible insulating material, such as polyimide resin or polyester resin.

Figure 5:
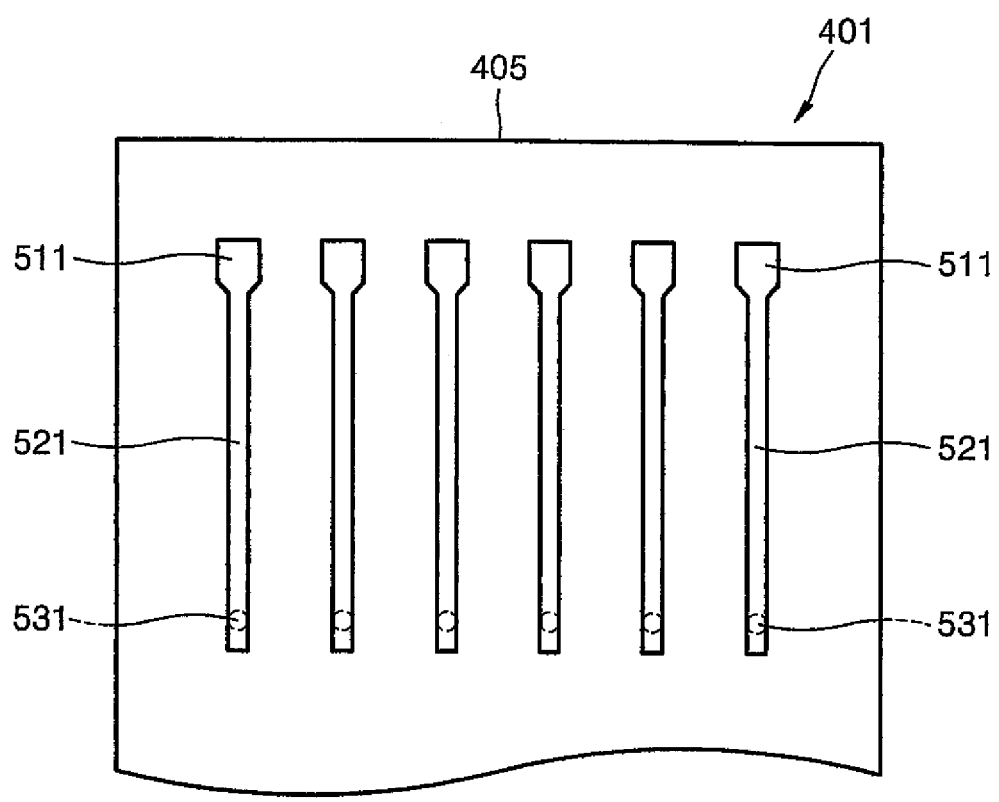
FIG. 5 is a bottom plan view of the film on which the display driver integrated circuit device of FIG. 3 is mounted.

FIG. 5 is a bottom plan view of film 401. Referring to FIG. 5, film 401 further comprises a plurality of input terminals 511 and a plurality of input signal lines 521 formed on an opposing side of insulated substrate 405.

Input terminals 511 are adapted for connection to a printed circuit board (PCB). Input signal lines 521 are respectively connected to input terminals 511. Input signal lines 521 may be electrically connected to second internal leads 441 via a plurality of vias 531 formed through insulated substrate 405. The plurality of vias 531, input terminal 511, and input signal lines 521 may also be formed from the same conductive materials as previously described.

Input signal lines 521 may also be covered with a protective layer, such as a solder resist, such that input signal lines 521 are protected from the surrounding environment. However, input terminals 511 are generally not covered by the protective layer.

As illustrated in FIGS. 4 and 5, output terminals 411, output signal lines 421, first internal leads 431, and second internal leads 441 may be formed on a surface of insulated substrate 405. Input terminals 511 and input signal lines 521 may be formed on an opposing surface of insulated substrate 405. Hence, the number of output signal lines 421 formed on insulated substrate 405 may be significantly increased.

Figure 6:
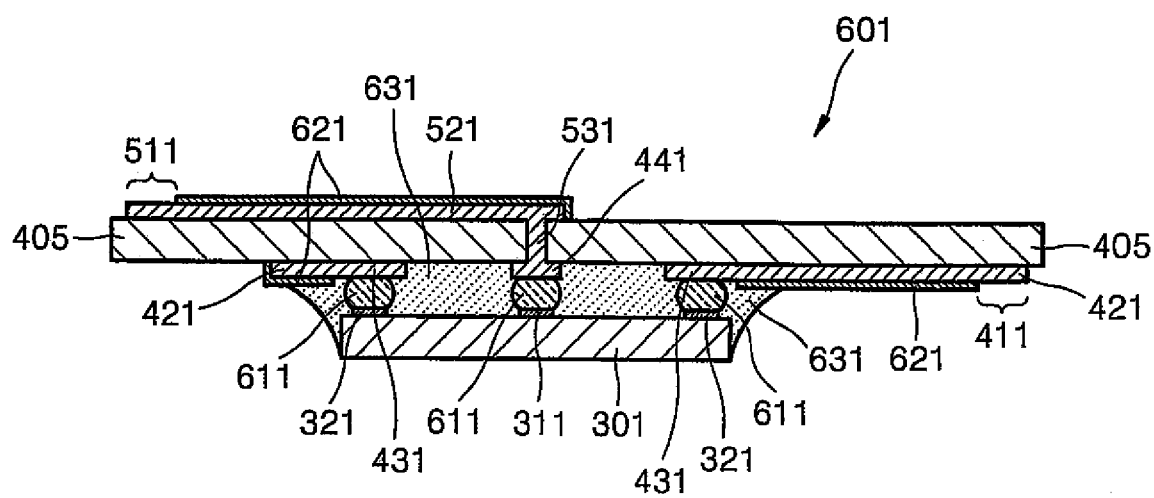
FIG. 6 is a lateral section of a film package according to an embodiment of the invention.

FIG. 6 is a lateral section view of a film package 601 according to an embodiment of the invention. Referring to FIG. 6, film package 601 comprises a display driver integrated circuit device 301 which is mounted on a film. Display driver integrated circuit device 301 may be mounted on the film, for example, using conventionally understood chip-on-film (COF) technology or tape-automated-bonding (TAB) technology.

Film 601 comprises an insulated substrate 405. Output terminals 411, output signal lines 421, first internal leads 431, and second internal leads 441 are formed on a surface of insulated substrate 405, and input terminals 511 and input signal lines 521 are formed on an opposing surface of insulated substrate 405. Second internal leads 441 are electrically connected to input signal lines 521 through vias 531 filled with a conductive material and formed in insulated substrate 405. Vias 531 may be formed using laser or punching technology, and the number of vias 531 will typically be equal to the number of second internal leads 441. Input signal lines 521 and output signal lines 421 may be covered by a protective layer 621.

A plurality of bumps 611 are respectively formed adhering to output pads 321 and input pads 311 of display driver integrated circuit device 301. Bumps 611 may be formed from a conductive material such as aluminium, gold, copper, or solder. Output pads 321 of display driver integrated circuit device 301 are electrically bonded to first internal leads 431. Input pads 311 of display driver integrated circuit device 301 are electrically bonded to second internal leads 441. Input and output pads 311 and 321 and first and second internal leads 431 and 441 may be bonded to each other using a conventionally understood thermal compression technique. Bonded input and output pads 311 and 321 and the first and second internal leads 431 and 441 may be sealed in an insulating resin 631 to protect them from external noise or mechanical impact. Epoxy resin or silicon resin may be used, for example, as insulating resin 631.

Referring to FIG. 6, input terminals 511 are formed opposite to output terminals 411. Since the relatively small-sized display driver integrated circuit device 301 is mounted on substrate 405, the overall size of film package 601 may be reduced.

Figure 7:
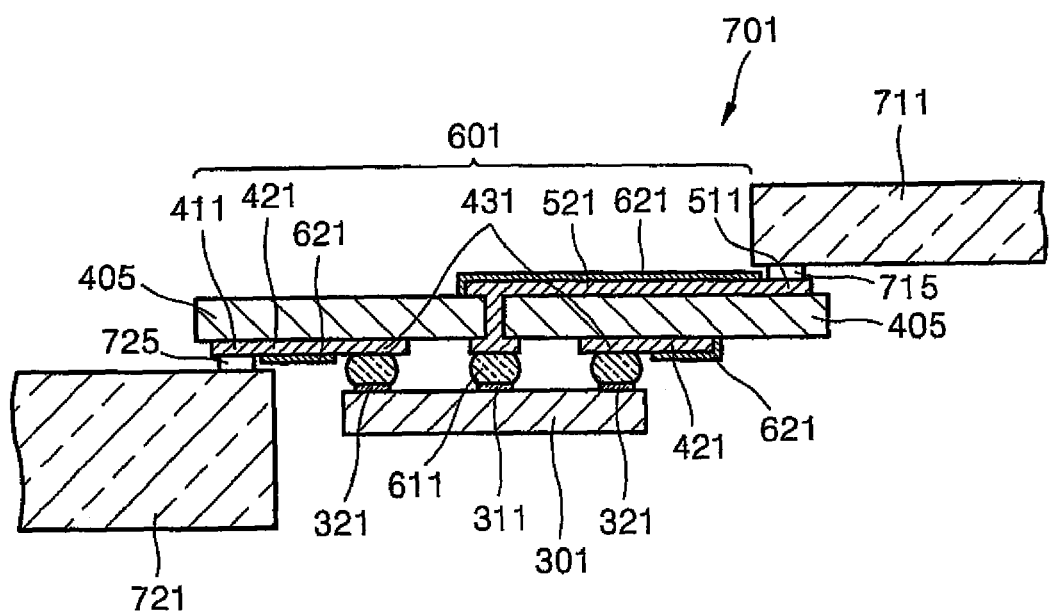
FIG. 7 is a lateral section of a flat panel display (FPD) module according to an embodiment of the invention.
Figure 8:
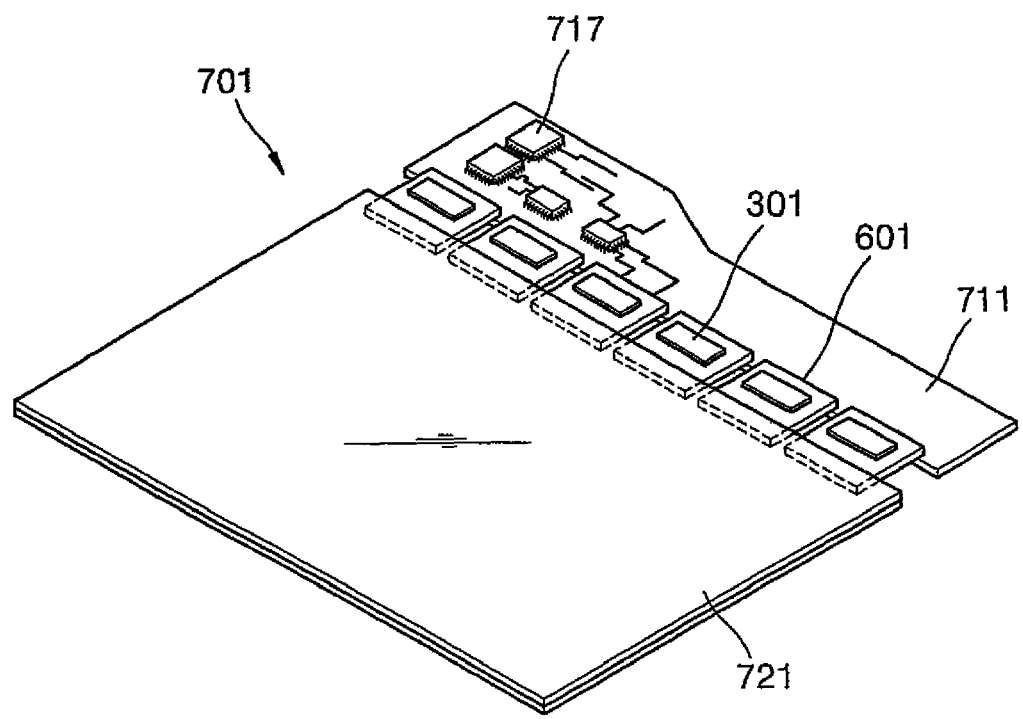
FIG. 8 is a plan view of the FPD module of FIG. 7.

FIG. 7 is a lateral section of a flat panel display (FPD) module 701 according to an embodiment of the invention. FIG. 8 is a plan view of FPD module 701. Referring to FIGS. 7 and 8, FPD module 701 comprises a film package 601, a PCB 711, and an FPD device 721.

Output terminals 715 from PCB 711 are connected to input terminals 511 of film package 601. Electrical devices 717 which provide electrical signals to display driver integrated circuit device 301 are mounted on PCB 711. Input terminals 725 of FPD device 721 are connected to output terminals 411 of film package 601.

Output terminals 715, input terminals 511, output terminals 411, and input terminals 725 may be respectively bonded to each other using a thermal compression process. In the thermal compression process, an adhesive, such as an anisotropic conductive film, may be applied between output terminals 715 of PCB 711, input terminals 511 of film package 601, output terminals 411 of film package 601, and input terminals 725 of FPD device 721.

FPD device 721 is adapted to display images and may be a liquid crystal display (LCD), a thin film transistor (TFT)-LCD, a plasma display panel (PDP), a field emission display (FED), or organic electroluminescence. Since FPD module 701 comprises film package 601 having a plurality of output signal lines 421 according to an embodiment of the invention, the overall size of FPD module 701 may be reduced.

As described above, since input pads 311 are arranged in a central portion of display driver integrated circuit device 301, first pitch P1 between adjacent input pads 311 may be sufficiently large to allow connection of associated ESD circuits.

Furthermore, since output pads 321 are arranged along all four side edges of display driver integrated circuit device 301, the number of output pads 321 may be significantly increased. If, however, the number of output pads 321 need not be increased within a particular embodiment of the invention, the overall size of a constituent display driver integrated circuit device 310 may then be reduced.

Output terminals 411, output signal lines 421, first internal leads 431, and second internal leads 441 may be formed on a surface of insulated substrate 405 of film 401, and input terminals 511 and input signal lines 521 may be formed on an opposing surface of insulated substrate 405. Therefore, the number of output signal lines 421 may be significantly increased. Consequently, the manufacturing costs associated with film 401, film package 601, and FPD module 701 may be reduced.

While the present invention has been particularly shown and described with reference to several exemplary embodiments, it will be understood by those of ordinary skill in the art that various changes in form and details may be made therein without departing from the scope of the invention as defined by the following claims.

What is claimed is:

1. A flat panel display (FPD) module comprising:
a rectangular display driver integrated circuit device mounted on a film and comprising a plurality of centrally arranged input pads, and a plurality of output pads arranged along edges of all four sides of the display driver integrated circuit device;
wherein the film comprises:
a plurality of output terminals disposed on a surface of an insulated substrate;
a plurality of output signal lines disposed on the surface of the insulated substrate and respectively connected to the plurality of output terminals;
a plurality of first internal leads disposed on the surface of the insulated substrate, respectively connected to the output signal lines, and arranged in a pattern defined in relation to the plurality of output pads;
a plurality of input terminals disposed on an opposing surface of the insulated substrate;
a plurality of input signal lines disposed on the opposing surface of the insulated substrate and connected to the input terminals;
a plurality of second internal leads disposed on the surface of the insulated substrate and arranged in relation to the input pads; and
a plurality of vias disposed through the insulated substrate and adapted to respectively connect the plurality of second internal leads and the plurality of input signal lines;
a printed circuit board (PCB) electrically bonded to the plurality of input terminals; and
a flat panel display (FPD) device adapted to display an image and electrically bonded to the plurality of output terminals.

2. The FPD module of claim 1, wherein the FPD device is a liquid crystal display or a plasma display panel.

3. The FPD module of claim 1, wherein the PCB comprises a plurality of electrical devices adapted to provide electrical signals to the display driver integrated circuit device.

* * * * *